(12) United States Patent
Okuni et al.

(10) Patent No.: US 8,461,887 B2
(45) Date of Patent: Jun. 11, 2013

(54) INTEGRATED CIRCUIT

(75) Inventors: Hidenori Okuni, Yokohama (JP);
Akihide Sai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/409,770

(22) Filed: Mar. 1, 2012

(65) Prior Publication Data
US 2013/0049822 A1    Feb. 28, 2013

(30) Foreign Application Priority Data
Aug. 26, 2011    (JP) .................................. 2011-185229

(51) Int. Cl.
*H03L 7/06*    (2006.01)
(52) U.S. Cl.
USPC ......................................... 327/156; 327/147
(58) Field of Classification Search
USPC ................................. 327/147, 156
See application file for complete search history.

(56) References Cited

U.S. PATENT DOCUMENTS

| | | | | |
|---|---|---|---|---|
| 7,746,956 B2 * | 6/2010 | Plevridis | ....................... | 375/296 |
| 7,869,541 B2 * | 1/2011 | Frantzeskakis et al. | ...... | 375/296 |
| 2006/0238226 A1 * | 10/2006 | Holland et al. | ............... | 327/115 |
| 2011/0159835 A1 * | 6/2011 | Xuan et al. | ..................... | 455/323 |
| 2011/0285435 A1 * | 11/2011 | Okabe | .......................... | 327/156 |

FOREIGN PATENT DOCUMENTS

JP    2006-121179 A    5/2006

* cited by examiner

*Primary Examiner* — Adam Houston
(74) *Attorney, Agent, or Firm* — Holtz, Holtz, Goodman & Chick, P.C.

(57) ABSTRACT

There is provided an integrated circuit in which a reference-signal source generates a reference signal having a basic frequency, a phase locked loop includes a voltage-controlled oscillator, a first frequency divider to generate a first frequency-divided signal based on the signal by N, a phase detector, a charge pump and a loop filter, the second frequency generates a second frequency-divided signal based on the signal generated by the voltage-controlled oscillator by M, wherein a minimum absolute value of a difference between the basic frequency multiplied by "K" and a frequency of the second frequency-divided signal is equal to or less than a low cutoff frequency of a bandpass filter or equal to or higher than a high cutoff frequency of the bandpass filter, the bandpass filter being represented by a transfer function from an input of the voltage-controlled oscillator to an output of the phase locked loop.

13 Claims, 6 Drawing Sheets

INTEGRATED CIRCUIT

CROSS REFERENCE TO RELATED APPLICATIONS

This application is based upon and claims the benefit of priority from the prior Japanese Patent Application No. 2011-185229, filed on Aug. 26, 2011, the entire contents of which are incorporated herein by reference.

FIELD

Embodiments relate to an integrated circuit and to, for example, a phase locked loop.

BACKGROUND

In a conventional phase locked loop (PLL), the wiring of an internal power supply is extended so as to reach a clock signal outputting circuit after the intermediation of an internal circuit. Power-supply noise reducing means is disposed in the wiring path from the internal circuit to the clock signal outputting circuit.

The above described power-supply noise reducing means is realized by a low-pass filter composed of a resistance element and a capacitor. These circuit elements lead to the problems of increase in the circuit size, increase in cost, etc.

DETAILED DESCRIPTION

According to an embodiment, there is provided an integrated circuit comprising: a reference-signal source, a phase locked loop, a second frequency divider, and a signal processing circuit.

The reference-signal source generates a reference signal having a basic frequency.

The phase locked loop includes a voltage-controlled oscillator to generate a signal having a frequency corresponding to a given control voltage, a first frequency divider to carry out frequency division on the signal by N to generate a first frequency-divided signal, a phase detector to detect a phase difference between the first frequency-divided signal and the reference signal, a charge pump to generate a current signal corresponding to the phase difference and a loop filter to generate the control voltage in accordance with the current signal.

The second frequency divider carries out the frequency division on the signal generated by the voltage-controlled oscillator by M to generate a second frequency-divided signal.

The signal processing circuit operates in synchronization with the second frequency-divided signal.

A minimum absolute value of a difference between the basic frequency multiplied by "K" ("K" is an arbitrary integer equal to or higher than 1) and a frequency of the second frequency-divided signal is equal to or less than a low cutoff frequency of a bandpass filter or equal to or higher than a high cutoff frequency of the bandpass filter, the bandpass filter being represented by a transfer function from an input of the voltage-controlled oscillator to an output of the phase locked loop.

Hereinafter, embodiments will be explained in detail with reference to drawings.

Figure 1:
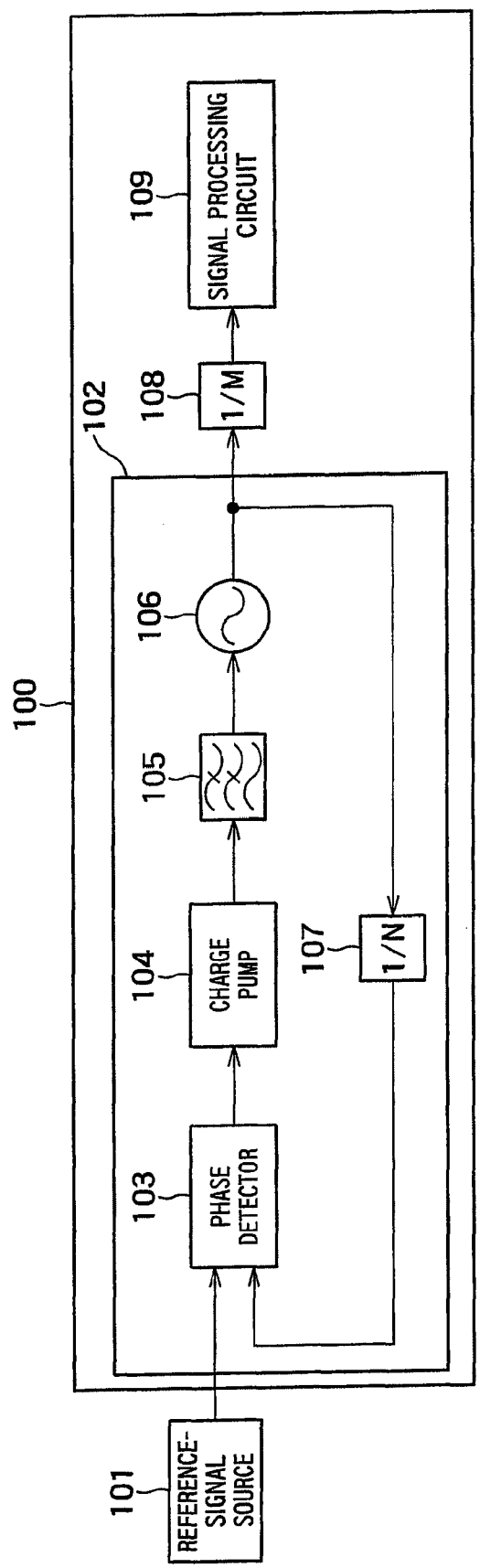
FIG. 1 is a drawing showing the configuration of an integrated circuit according to a first embodiment.

FIG. 1 is a drawing showing the configuration of an integrated circuit 100 including a phase locked loop 102 according to a first embodiment.

The integrated circuit 100 of FIG. 1 is provided with a phase locked loop 102, a frequency divider (second frequency divider) 108, and a signal processing circuit 109.

The phase locked loop 102 is provided with a phase detector 103, a charge pump 104, a loop filter 105, a voltage-controlled oscillator 106, and a frequency divider (first frequency divider) 107.

A reference-signal source 101 is disposed in the input side of the integrated circuit 100. The reference-signal source 101 generates a reference signal having a predetermined basic frequency f1. The reference signal includes a frequency component which is the integral multiple (K times) of the basic frequency f1. The reference-signal source 101 outputs the generated reference signal to the integrated circuit 100. The phase locked loop 102 is fed with the reference signal generated by the reference-signal source 101.

The voltage-controlled oscillator 106 generates a signal of a frequency corresponding to a given control voltage.

Figure 2:
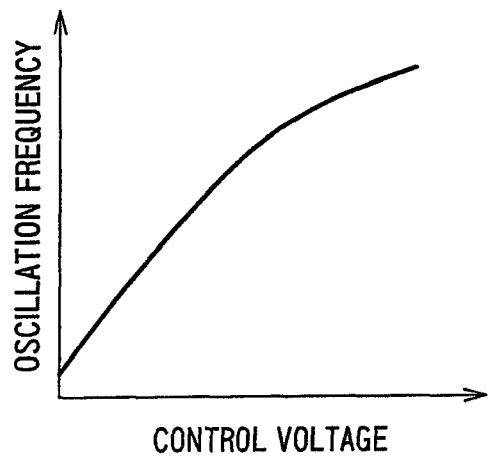
FIG. 2 is a drawing showing the relation between the control voltage and oscillation frequency in a voltage-controlled oscillator.

FIG. 2 shows an example of the conversion characteristics of the control voltage and the frequency of the voltage-controlled oscillator 106. As shown in the drawing, the conversion characteristics of the control voltage and the frequency of the voltage-controlled oscillator 106 are characterized by being non-linear.

The voltage-controlled oscillator 106 outputs the generated signal to the frequency divider 107 and the frequency divider 108.

The frequency divider 107 divides by a frequency dividing ratio N the frequency of the signal generated by the voltage-controlled oscillator 106 and outputs a frequency-divided signal (first frequency-divided signal) to the phase detector 103.

The frequency divider 108 divides by a frequency dividing ratio M the signal generated by the voltage-controlled oscillator 106 and outputs a frequency-divided signal (second frequency-divided signal) to the signal processing circuit 109. If the frequency of the reference signal is f1, the frequency of the frequency-divided signal output from the frequency divider 108 is "f1×N/M".

The phase detector 103 detects the phase difference "Δϕ" between the reference signal generated by the reference-signal source 101 and the frequency-divided signal from the frequency divider 107. Specifically, the phase difference "ΔΦ" between the reference signal and the frequency-divided signal from the frequency divider 107 is directly converted to a voltage.

The phase difference "Δφ" is the phase ($\phi_{div}$) of the frequency-divided signal viewed from the phase ($\phi_{ref}$) of the reference signal and can be expressed as "Δφ=$\phi_{ref}$-$\phi_{div}$". If the phase difference "Δφ" is negative, the phase of the frequency-divided signal is more advanced than that of the reference signal. If "Δφ" is positive, the frequency-divided signal is more delayed than the reference signal.

However, this definition is an example, and the phase difference can be reversely defined. In other words, the phase of the reference signal viewed from the phase of the frequency-divided signal may be defined as the phase difference.

The charge pump 104 generates a current signal in accordance with the voltage detected by the phase detector 103 and outputs the generated current signal to the loop filter 105.

The loop filter 105 smoothes the current signal fed from the charge pump to generate the control voltage to be given to the voltage-controlled oscillator 106.

The signal processing circuit 109 includes a circuit part which operates in synchronization with the frequency-divided signal input from the frequency divider 108.

The integrated circuit 100 has a characteristic that the absolute value of the difference between the basic frequency multiplied by "K" ("K" is an arbitrary integer equal to or higher than 1) and the frequency of the output signal of the frequency divider 108 is equal to or lower than a low cutoff frequency of a bandpass filter or equal to or higher than a high cutoff frequency of the bandpass filter (the bandpass filter represented by the transfer function from the input of the voltage-controlled oscillator 106 to the output of the phase locked loop 102) which works by the feedback of the phase locked loop 102.

Particularly, the frequency of a spurious wave (spurious signal) generated at the smallest value of the absolute of the difference between the integral multiple of the frequency of the reference signal of the reference-signal source 101 and the frequency of the output signal of the frequency divider 108 is equal to or less than the low cutoff frequency of the bandpass filter, particularly, equal to or less than one-fifth of the low cutoff frequency.

Such a characteristic is realized by adjusting the values of the frequency dividing ratios "N" and "M", the output current of the charge pump, and the cutoff frequency of the loop filter 105.

Hereinafter, the background why the inventor of the present application conceived of such characteristics will be described.

The isolation of each circuit block that can be owned by the integrated circuit 100 is limited. Therefore, the signal components generated between the blocks leak to the other blocks as spurious signals, and there is a problem that performance is deteriorated.

The reference signal output from the reference-signal source 101 has the frequency component which is the integral multiple "K" of the basic frequency "f1". The signal processing circuit 109 includes the circuit part which operates in synchronization with an input clock signal (the output signal of the frequency divider 108), and a consumed current "ΔI" is varied in accordance with operating conditions. The impedances of power-supply wiring and ground wiring are considered to be $R_{VDD}$ and $R_{GND}$. Since the signal processing circuit 109 operates in synchronization with the input clock, "ΔI ($R_{VDD}$+$R_{GND}$)" is generated as the voltage variation between the power supply and the ground at the timing of rise or decay (or both of them) of the clock.

Figure 3:
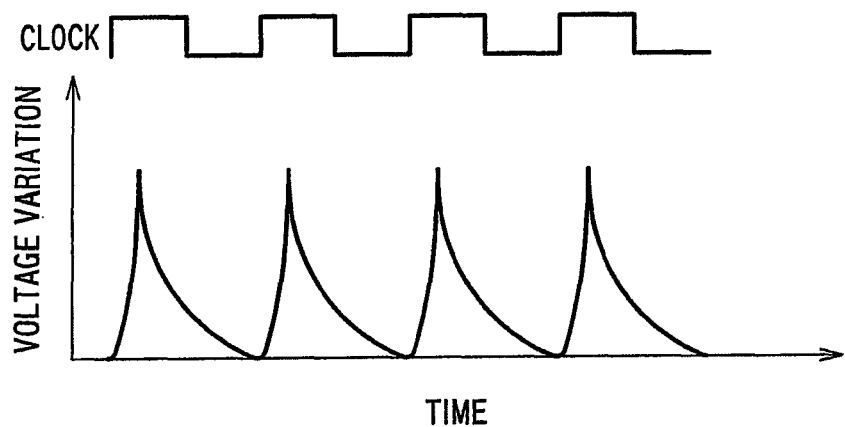
FIG. 3 is a drawing schematically showing power-supply voltage variation caused by operation of a signal processing circuit.

FIG. 3 schematically shows the voltage variation of the signal processing circuit 109 which operates at the rise of the clock. Since it operates at the rise of the clock, it can be understood that voltage variation is cyclically generated at the cycle of the clock.

As described above, since the isolation characteristics between the blocks in the integrated circuit 100 are limited, the spurious signals generated in accordance with the voltage variation leak to the other blocks and deteriorate characteristics. This characteristic deterioration is particularly large in the voltage-controlled oscillator 106.

Figure 4:
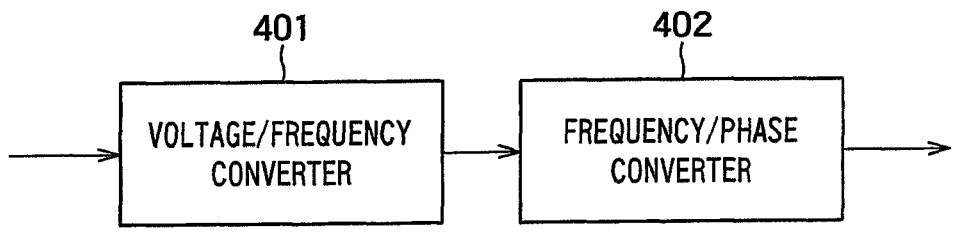
FIG. 4 is a drawing showing the configuration of the voltage-controlled oscillator.

As shown in FIG. 4, the voltage-controlled oscillator (VCO) 106 can be considered to have two functions of a control-voltage/frequency converter 401 and a frequency/phase converter 402. The voltage-controlled oscillator 106 oscillates at a frequency proportional to the control voltage (see 504 of FIG. 5 described later). Since the input of the phase locked loop (PLL) has to be input as a phase, the frequency is integrated and converted to phase information (see 505 in FIG. 5 described later). In the control-voltage/frequency converter 401, minute voltage variation is converted to frequency variation; therefore, if even a small amount of interference signal leaks thereinto from another block, characteristic deterioration of the output signal of the voltage-controlled oscillator 401 notably appears.

Figure 5:
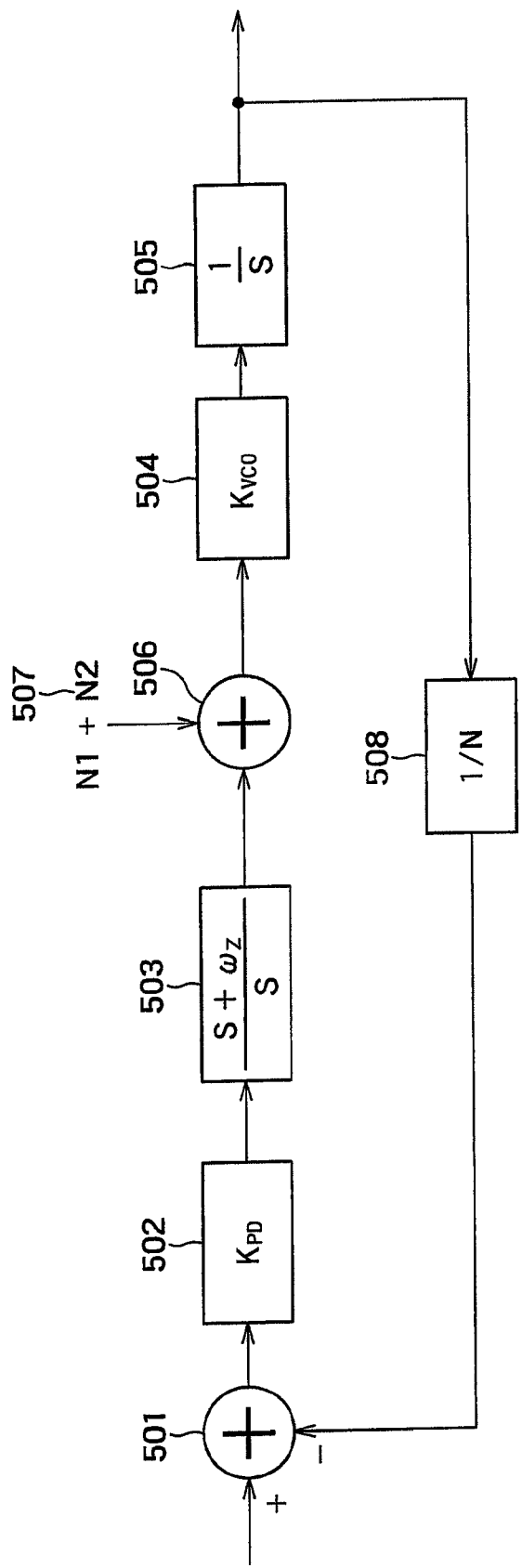
FIG. 5 is a drawing in which a phase locked loop is made into a model.

FIG. 5 shows the transfer function characteristic from the input of the reference signal to the output of the voltage-controlled oscillator 106 in the case in which spurious signals leak to the power-supply wiring, ground wiring, and/or input signal wiring of the voltage-controlled oscillator 106 due to the power-supply voltage variation generated in the signal processing circuit 109.

The transfer function characteristic shown in FIG. 5 is composed of the blocks of a subtraction 501, a gain "$K_{PD}$" 502 of the phase detector, a transfer function 503, a voltage/frequency conversion gain 504, an integral characteristic 505, an adder 506 and a frequency division 508.

The transfer function 503 represents the synthesized characteristic of the charge pump 104 and the loop filter 105.

The voltage/frequency conversion gain 504 and the integral characteristic 505 represent the transfer function of the voltage-controlled oscillator. The integral characteristic 505 represents frequency/phase conversion.

The frequency division 508 is a model of the frequency divider 107.

The adder 506 represents a spurious wave 507 which leaks to the power-supply wiring, ground wiring, and/or input signal wiring of the voltage-controlled oscillator 106. The spurious wave 507 is synthesis (N1+N2) of spurious waves "N1" and "N2".

The spurious wave "N1" is the wave generated in the voltage-controlled oscillator 106 due to the signal output from the reference-signal source 101 and has a frequency component which is the integral multiple "K" of the basic frequency "f1".

The spurious wave "N2" is the wave generated in the voltage-controlled oscillator 106 due to the power-supply voltage variation generated in the signal processing circuit 109 and has a frequency component of the frequency "f2" (the frequency of the output signal of the frequency divider 108) of the clock input to the signal processing circuit 109.

As described above, the frequency of the input signal to the signal processing circuit 109 is the frequency "f1" of the reference-signal source multiplied by "N/M".

Therefore, the closed-loop transfer function from the input of the spurious wave 507 (N1+N2) to the output of the phase locked loop 102 is as described below.

$$\frac{Out}{(N1+N2)} = \frac{K_{VCO}s}{s^2 + (K_{PD}K_{VCO}s + K_{PD}K_{VCO}\omega_z)/N} \quad \text{[Formula 1]}$$

Figure 6:
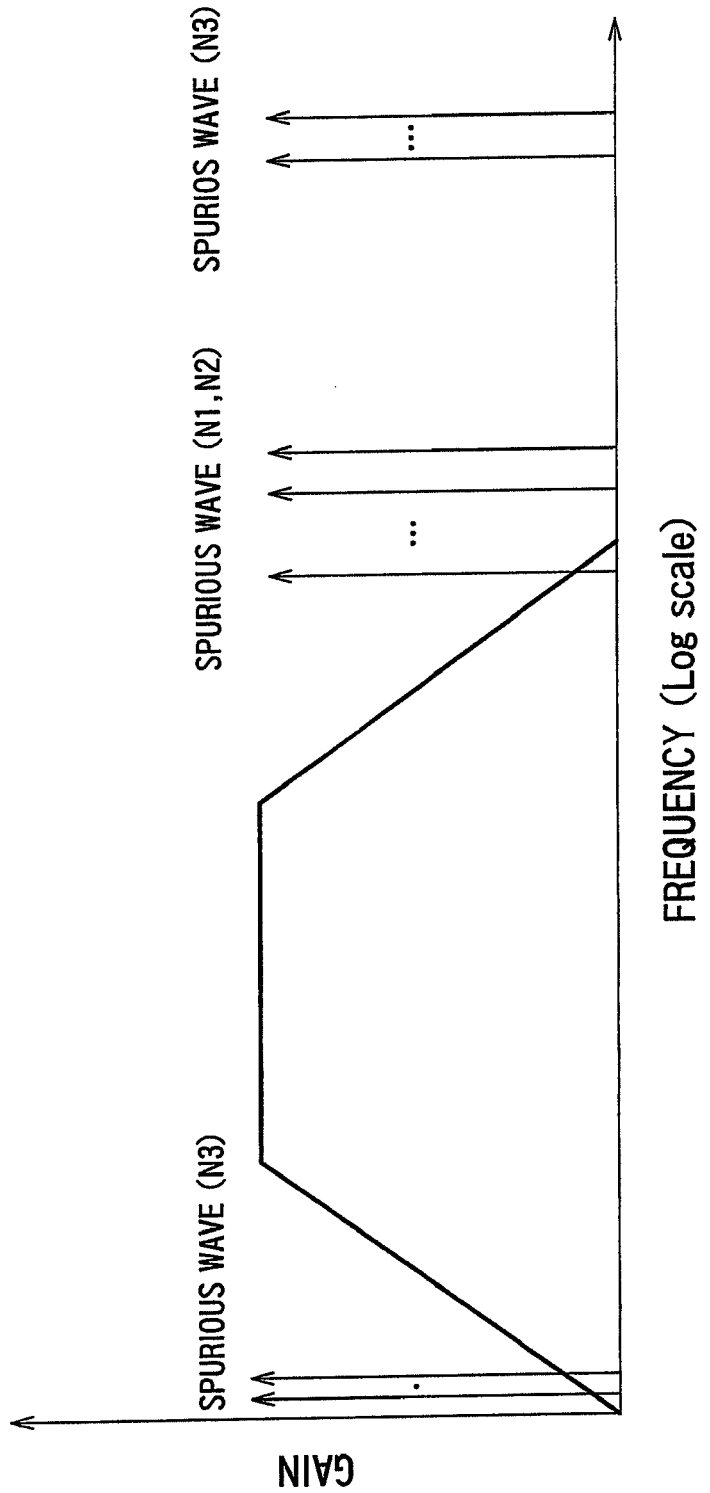
FIG. 6 is a drawing showing the band of a bandpass filter and the frequencies of various spurious waves.

The closed-loop transfer function serves as a bandpass filter. As shown in FIG. 6, it can be understood that, when the high cutoff frequency of the bandpass filter is equal to or lower than ⅕ of the frequency "f1" of the reference-signal source, the spurious waves "N1" and "N2" which leak in can be suppressed.

Figure 7:
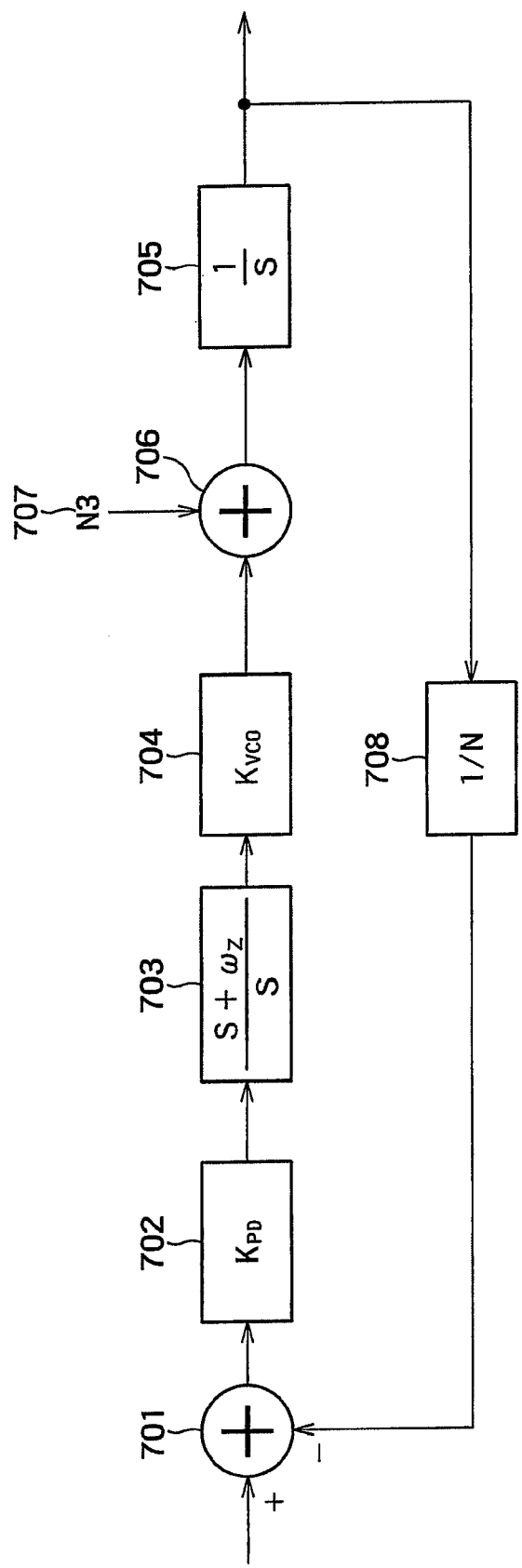
FIG. 7 is a drawing in which the phase locked loop is made into a model in consideration of intermodulation distortion.

Since the voltage/frequency converter 401 has the non-linear characteristic (see FIG. 2), intermodulation distortion caused by the spurious waves "N1" and "N2" are also generated in the output of the voltage/frequency converter 401. When the distortion component is "N3", the phase locked loop can be made into a model as shown in FIG. 7. The input of the distortion component "N3" is expressed by an adder 706 between a voltage/frequency conversion gain 704 and an integral characteristic 705. Since the elements 701, 702, 703, 704, 705 and 708 are similar to 501, 502, 503, 504, 505 and 508 of FIG. 5, explanations thereof will be omitted.

The closed-loop transfer function from the input of the distortion component "N3" to the output of the phase locked loop is as described below.

$$\frac{Out}{N3} = \frac{s}{s^2 + (K_{PD}K_{VCO}s + K_{PD}K_{VCO}\omega_z)/N}$$ [Formula 2]

This transfer function serves as a bandpass filter as well as Formula 1. When the spurious waves "N1" and "N2" have frequency components "K*f1, f2", respectively, spurious waves having frequency components of "K*f1+f2" and "K*f1−f2" are generated as second-order distortion. Spurious waves having frequency components of "2*K*f1−f2", "2*K*f1+f2", "K/f1−2*f2" and "K*f1+2*f2" are generated as third-order distortion.

A non-linear model is expressed by a formula as described below.

$$y(t)=\alpha_1 x(t)+\alpha_2 x^2(t)+\alpha_3 x^3(t)+$$ [Formula 3]

For example, when two cosine waves serve as an input signal "x(t)=A₁ cos ω₁t+A₂ cos ω₂t", a below formula is obtained when up to third-order distortion is taken into consideration.

$$y(t) =$$ [Formula 4]

$$a_1(A_1\cos\omega_1 t + A_2\cos\omega_2 t) + a_2(A_1\cos\omega_1 t + A_2\cos\omega_2 t)^2 +$$

$$a_3(A_1\cos\omega_1 t + A_2\cos\omega_2 t)^3 =$$

$$\left(a_1 A_1 + \frac{3}{4}a_3 A_1^3 + \frac{3}{2}a_3 A_1 A_2^2\right)\cos\omega_1 t +$$

$$\left(a_1 A_2 + \frac{3}{4}a_3 A_2^3 + \frac{3}{2}a_3 A_2 A_1^2\right)\cos\omega_2 t +$$

$$a_2 A_1 A_2 \cos(\omega_1 + \omega_2)t + a_2 A_1 A_2 \cos(\omega_1 - \omega_2)t +$$

$$\frac{3a_3 A_1^2 A_2}{4}\cos(2\omega_1 + \omega_2)t + \frac{3a_3 A_1^2 A_2}{4}\cos(2\omega_1 - \omega_2)t +$$

$$\frac{3a_3 A_2^2 A_1}{4}\cos(2\omega_2 + \omega_1)t + \frac{3a_3 A_2^2 A_1}{4}\cos(\omega_1 - 2\omega_2)t$$

As shown in above described Formula, distortion components are generated in the frequency components of "f1+f2", "f1−f2", "2f1−f2", "2f1+f2", "f1−2f2" and "f1+2f2". Note that "ω₁" is equal to "2πf₁", and "ω₂" is equal to "2πf₂".

The spurious waves generated in the high-frequency signal components (K*f1+f2, 2*K*f1+f2, K*f1+2*f2) as intermodulation distortion can be suppressed when the high cutoff frequency of the bandpass filter is equal to or lower than ⅕ of the basic frequency of the reference-signal source.

However, the intermodulation distortion is also generated in the difference components (K*f1−f2, 2*K*f1−f2, K*f1−2*f2) of the frequencies as described above. Therefore, the difference components are contained in the pass-band of the filter, the spurious waves cannot be suppressed, and characteristics are significantly deteriorated. More specifically, in the case of "K" with which the absolute values of "K*f1−f2", "2*K*f1−f2", and "K*f1−2*f2" become the minimum, spurious waves can be generated in the band which is equal to or lower than the high cutoff frequency of the bandpass filter multiplied by 5. "K" with which the absolute values become the minimum is different depending on the values of "f1" and "f2". For example, if "f1=36 MHz" and "f2=351 MHz" are presupposed in the case of "2Kf1−f2", the minimum of "2*5*36M−351M=9M" is obtained when K=5. Similarly, in the case of |Kf1−f2|, the minimum of "10*36M−351M=9M" is obtained when K=10.

Therefore, the frequency dividing ratios "N" and "M" of the frequency dividers 107 and 108 are set so that the low cutoff frequency of the bandpass filter is equal to or higher than 5 times the minimum frequency |Kf1−f2| of the spurious waves generated in the second-order distortion. Thus, the spurious waves caused by the second-order distortion can be suppressed, and the characteristic deterioration can be reduced. In the case in which "K" is assumed to be "Kmin" with which the absolute value becomes the minimum, if the value is changed to "Kmin±1", "Kmin±2", and so on, the low cutoff frequency may be exceeded in some cases. However, the frequency |Kf1−f2| of the spurious wave in that case becomes equal to or higher than "f1" and therefore becomes equal to or higher than the high cutoff frequency. Therefore, such spurious waves can be also removed.

Also, the frequency dividing ratios "N" and "M" of the frequency dividers 107 and 108 are changed so that the low cutoff frequency of the bandpass filter becomes equal to or higher than the minimum frequencies |2Kf1−f2| and |Kf1−2f2| of the spurious waves generated in the third-order distortion multiplied by 5. Thus, the spurious waves caused by the third-order distortion can be suppressed, and the characteristic deterioration can be reduced.

The characteristic deterioration can be reduced by adjusting the frequency dividing ratios "N" and "M" in this manner. The operation of the integrated circuit 100 in which the characteristic deterioration is reduced in this manner will be explained below in detail.

As a comparative example, the operation of the case in which the frequency dividing ratios "N" and "M" are not adjusted in accordance with the present embodiment will be shown. For example, it is assumed that the frequency of the reference-signal source 101 is 36 MHz, the frequency division of the frequency divider 107 is 1/78 (in other words, the frequency dividing ratio N=78), and the frequency division of the frequency divider 108 is 1/8 (in other words, the frequency dividing ratio M=8). As the frequency components of the spurious waves which leak to the voltage-controlled oscillator 106, it is assumed that a spurious wave which is the integral multiple of 36 MHz from the reference-signal source 101 and a spurious wave of 351 MHz from the signal processing circuit 109 leak thereto. The low cutoff frequency of the bandpass filter is assumed to be 3.4 MHz, and the high cutoff frequency is assumed to be 3.8 MHz. In this case, the high cutoff frequency of the bandpass filter is equal to or lower than ⅕ of the spurious wave of the reference-signal source, and the spurious wave can be suppressed. However, a spurious wave is generated at 9 MHz (=10*36M−351M) as a second-order distortion component due to intermodulation, and spurious waves are further generated at 9 MHz (=2*5*36M−351M) and 18 MHz (=20*36M−2*351M) as a third-order distortion component. However, these spurious waves cannot be sufficiently suppressed by the bandpass filter (the frequencies of these spurious waves are larger than the low cutoff frequency of the bandpass filter), and the characteristics are deteriorated.

On the other hand, the operation of the case in which the frequency dividing ratios "N" and "M" are adjusted in accordance with the present embodiment is as described below. It is assumed that the frequency of the reference-signal source 101 is 36 MHz, the frequency division of the frequency divider 107 is "1/80", and the frequency division of the frequency divider 108 is "1/7.99". As the frequency components of the spurious waves which leak to the voltage-controlled oscillator 106, it is assumed that a spurious wave having the frequency of the integral multiple of 36 MHz from the reference-signal source 101 and a spurious wave of 360 MHz from the signal processing circuit 106 flow thereto. The low cutoff frequency of the bandpass filter is assumed to be 3.4 MHz, and the high cutoff frequency is assumed to be 3.8 MHz. The high cutoff frequency of the bandpass filter is equal to or less than ⅕ of the spurious wave of the reference-signal source 101, and sufficient suppression can be carried out. A spurious wave of a minimum frequency component is generated at about 451 kHz (=10*36M−360.45M) as a second-order distortion component due to intermodulation, and spurious waves of minimum frequency components are generated at about 451 kHz (=2*5*36M−360.45M) and at about 901 kHz (20*36M−2*360.45M) as a third-order distortion component. Since these spurious waves are sufficiently smaller than the low cutoff frequency of the bandpass filter, the spurious waves can be sufficiently suppressed by the bandpass filter, and characteristic deterioration can be prevented.

The lower the frequency the more the amount of suppression is improved in the bandpass filter. Therefore, the closer the minimum frequency of the absolute value of the spurious wave to zero (DC), the more the spurious wave can be suppressed, and the characteristic deterioration can be prevented. As described above, the minimum frequency of the second-order distortion component is |K*f1−f2| which can be expanded to |K−N/M|*f1. Therefore, when the values of "N" and "M" are adjusted to the condition of K=N/M, in other words, the ratio of the frequency dividing ratio "N" of the frequency divider 107 and the frequency dividing ratio "M" of the frequency divider 108 becomes the integer (=K), the minimum frequency of the second-order distortion can be reduced to zero, and characteristics can be improved.

Similarly, the minimum frequency of the third-order component can be expanded to |2K−N/M|*f1 and |K−2N/M|*f1. When the values of "N" and "M" are adjusted so that the ratio of the frequency dividing ratio "N" of the frequency divider 107 and the frequency dividing ratio "M" of the frequency divider 108 becomes an even number, the minimum frequency of the third-order distortion can be reduced to zero, and the characteristic deterioration can be prevented.

Figure 8:
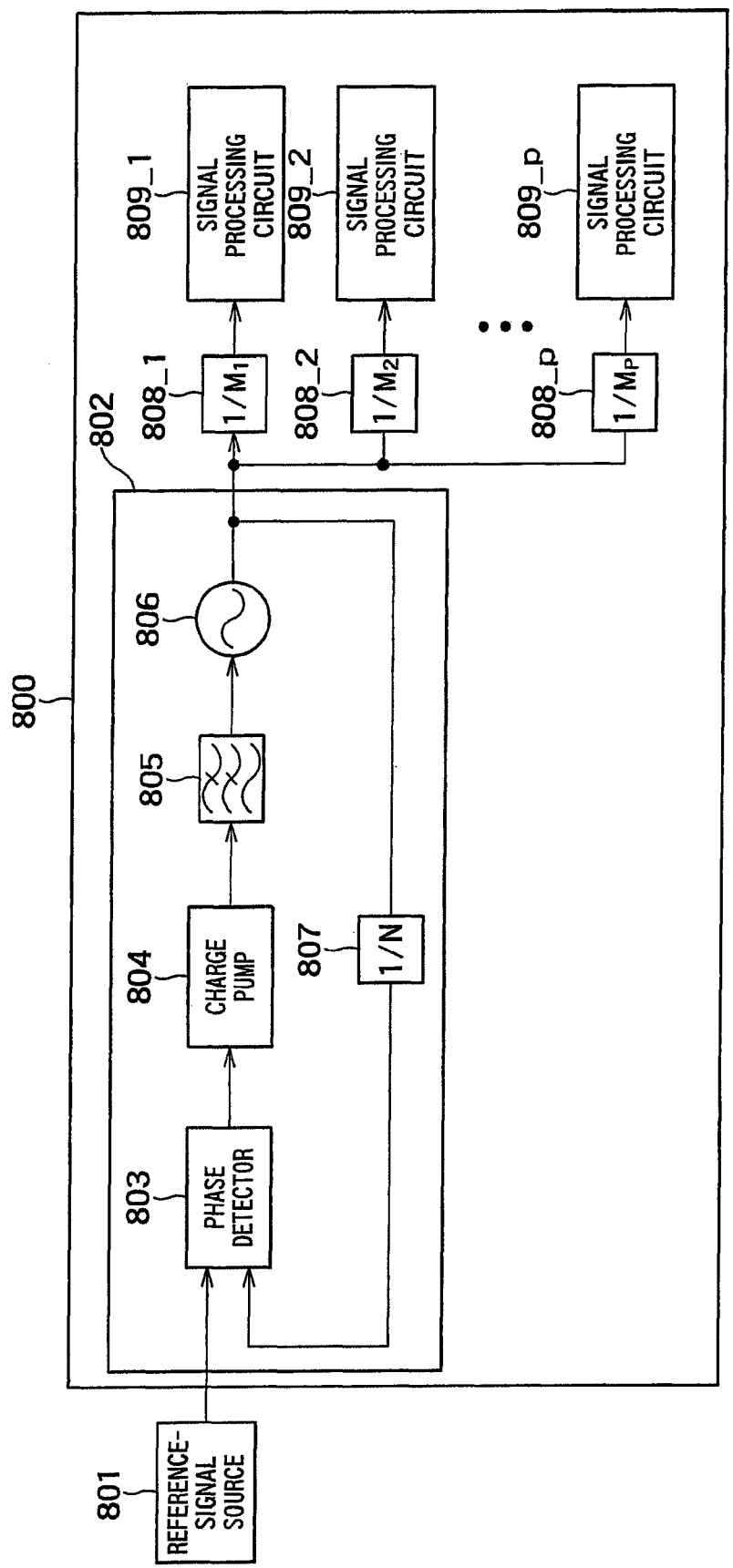
FIG. 8 is a drawing showing the configuration of an integrated circuit including a phase locked loop according to a second embodiment.

FIG. 8 is a drawing showing a configuration of an integrated circuit 800 including a phase locked loop 802 according to a second embodiment.

The integrated circuit 800 of FIG. 8 is provided with the phase locked loop 802, p frequency dividers 808_1, 808_2, . . . 808_p, and p signal processing circuits 809_1, 809_2, . . . 809_p. The frequency dividers 808_1 to 808_p have different frequency dividing ratios M1, M2, . . . Mp.

The phase locked loop 802 is provided with a phase detector 803, a charge pump 804, a loop filter 805, a voltage-controlled oscillator 806, and a frequency divider 807. The voltage-controlled oscillator 806 has a control-voltage/frequency conversion characteristic which is non linear as well as the first embodiment.

The operation of each of the blocks is similar to the blocks having the same names in the first embodiment, and detailed explanations thereof will be omitted.

Spurious waves generated by the signal processing circuits 809_1 to 809_p leak to the input of the voltage-controlled oscillator 806. The characteristic of the voltage-controlled oscillator 806 is deteriorated due to intermodulation distortion of the spurious wave of the reference-signal source 801 and the spurious waves from the signal processing circuits 809_1 to 809_p.

Therefore, when the low cutoff frequency of the bandpass filter is equal to or higher than five times the frequency of the spurious-wave frequency generated by each mutual distortion, the characteristic deterioration can be prevented. In this process, it is preferred that the distortion caused by the signal processing circuit having the largest power consumption be preferentially removed. The larger the power consumption of the circuit is, the larger the amount that serves as spurious waves becomes. Therefore, when the circuit having the large power consumption is taken care of, the characteristic deterioration can be effectively prevented. Therefore, it is effective to set the low cutoff frequency of the bandpass filter equal to or higher than five times the frequency of the spurious wave generated by the mutual distortion of the wave from the signal processing circuit having the largest power consumption and the reference wave.

As described above, as the frequency components of mutual distortion, $|K-N/M_q|*f1$ is generated as second-order distortion, and $|2*K-N/M_q|*f1$ and $|K-2*N/M_q|*f1$ are generated as third-order distortion ("q" is an integer of 1 to p). When the frequency dividing ratios "N" and "$M_q$" of the frequency dividers are powers of 2, "N/M" becomes an integer and an even number; therefore, at least one of $|2*K-N/M_q|$ and $|K-2*N/M_q|$ can be reduced to zero. As a result, even when a plurality of signal processing circuits are present, the frequency components of the second-order distortion and the third-order distortion caused by at least one of them can be caused to be "DC". Thus, spurious waves can be removed, and the characteristic deterioration can be prevented.

In this process, it is preferred that the spurious wave caused by the signal processing circuit having the largest power consumption be preferentially removed for the reason similar to that described above. Therefore, reducing at least one of $|2*K-N/M_q|$ and $|K-2*N/M_q|$ to zero about the signal processing circuit having the largest power consumption is effective.

The present invention is not limited to the exact embodiments described above and can be embodied with its components modified in an implementation phase without departing from the scope of the invention. Also, arbitrary combinations of the components disclosed in the above-described embodiments can form various inventions. For example, some of the all components shown in the embodiments may be omitted. Furthermore, components from different embodiments may be combined as appropriate.

The invention claimed is:

1. An integrated circuit comprising:
   a reference-signal source to generate a reference signal having a basic frequency;
   a phase locked loop including
   a voltage-controlled oscillator to generate a signal having a frequency corresponding to a given control voltage, a first frequency divider to carry out frequency division on the signal by N to generate a first frequency-divided signal, a phase detector to detect a phase difference between the first frequency-divided signal and the reference signal, a charge pump to generate a current signal corresponding to the phase difference, and a loop filter to generate the control voltage in accordance with the current signal;

a second frequency divider to carry out the frequency division on the signal generated by the voltage-controlled oscillator by M to generate a second frequency-divided signal; and a signal processing circuit to operate in synchronization with the second frequency-divided signal, wherein a minimum absolute value of a difference between the basic frequency multiplied by "K" ("K" is an arbitrary integer equal to or higher than 1) and a frequency of the second frequency-divided signal is equal to or less than a low cutoff frequency of a bandpass filter or equal to or higher than a high cutoff frequency of the bandpass filter, the bandpass filter being represented by a transfer function from an input of the voltage-controlled oscillator to an output of the phase locked loop.

2. The circuit according to claim 1, wherein a minimum absolute value of the difference between the basic frequency multiplied by an even number of 2 or higher and the frequency of the second frequency-divided signal and a minimum absolute value of the difference between the basic frequency multiplied by "K" ("K" is an arbitrary integer equal to or higher than 1) and the frequency of the second frequency-divided signal multiplied by 2 are equal to or lower than the low cutoff frequency or equal to or higher than the high cutoff frequency of the bandpass filter.

3. The circuit according to claim 1, wherein
a ratio of "N" to "M" matches "K".

4. The circuit according to claim 1, wherein
a ratio of "N" to "M" matches "K" multiplied by 2.

5. The circuit according to claim 1, wherein
the minimum absolute value is equal to or lower than one fifth of the low cutoff frequency.

6. The circuit according to claim 2, wherein the minimum absolute value of the difference between the basic frequency multiplied by the even number of 2 or higher and the frequency of the second frequency-divided signal and the minimum absolute value of the difference between the basic frequency multiplied by "K" ("K" is an arbitrary integer equal to or higher than 1) and the frequency of the second frequency-divided signal multiplied by 2 are equal to or lower than one fifth of the low cutoff frequency.

7. The circuit according to claim 1, further comprising:
P second frequency dividers; and
P signal processing circuits corresponding to the P second frequency dividers, wherein
the P second frequency dividers carry out frequency division by different frequency dividing ratios to generate P second frequency-divided signals;
the P signal processing circuits operate in synchronization with the respectively-corresponding one of the P second frequency-divided signals; and an absolute value of the difference between the basic frequency multiplied by "K" ("K" is an arbitrary integer equal to or higher than 1) and at least one frequency of the P second frequency-divided signals is equal to or lower than the low cutoff frequency or equal to or higher than the high cutoff frequency of the bandpass filter.

8. The circuit according to claim 7, wherein
the minimum absolute value of the difference between the basic frequency multiplied by "K" and a frequency of at least one of the P second frequency-divided signals is equal to or lower than one fifth of the low cutoff frequency.

9. The circuit according to claim 7, wherein
an absolute value of the difference between the basic frequency multiplied by an even number of 2 or higher and a frequency of at least one of the P second frequency-divided signals and an absolute value of the difference between the basic frequency multiplied by "K" ("K" is an arbitrary integer of 1 or higher) and a frequency of at least one of the P second frequency-divided signals multiplied by 2 are equal to or lower than the low cutoff frequency or equal to or higher than the high cutoff frequency of the bandpass filter.

10. The circuit according to claim 9, wherein
a frequency dividing ratio of each of the P second frequency dividers is a power of 2.

11. The circuit according to claim 9, wherein
a minimum absolute value of the difference between the basic frequency multiplied by the even number of 2 or higher and a frequency of at least one of the P second frequency-divided signals and a minimum absolute value of the difference between the basic frequency multiplied by "K" ("K" is an arbitrary integer equal to or higher than 1) and a frequency of at least one of the P second frequency-divided signals multiplied by 2 are equal to or lower than one fifth of the low cutoff frequency.

12. The circuit according to claim 1, further comprising:
P second frequency dividers; and
P signal processing circuits corresponding to the P second frequency dividers, wherein
the P second frequency dividers carry out frequency division by different frequency dividing ratios to generate P second frequency-divided signals;
the P signal processing circuits operate in synchronization with the respectively-corresponding one of the P second frequency-divided signals; and
an absolute value of the difference between the basic frequency multiplied by "K" and the frequency of the second frequency divided signal used by the signal processing circuit having largest power consumption among the P signal processing circuits is equal to or lower than the low cutoff frequency or equal to or higher than the high cutoff frequency of the bandpass filter.

13. The circuit according to claim 12, wherein
a minimum absolute value of the difference between the basic frequency multiplied by "K" and the frequency of the second frequency-divided signal used by the signal processing circuit having the largest power consumption among the P signal processing circuits is equal to or lower than one fifth of the low cutoff frequency.

* * * * *